(12) United States Patent
Lee et al.

(10) Patent No.: US 9,416,296 B2
(45) Date of Patent: Aug. 16, 2016

(54) RESIST UNDERLAYER COMPOSITION AND METHOD FOR FORMING PATTERN USING SAME

(71) Applicant: DONGJIN SEMICHEM CO., LTD., Incheon (KR)

(72) Inventors: Jung-Youl Lee, Gyeonggi-do (KR); Young Bae Lim, Gyeonggi-do (KR); Jong-Won Kim, Gyeonggi-do (KR); Jae Woo Lee, Gyeonggi-do (KR); Jae Hyun Kim, Seoul (KR)

(73) Assignee: DONGJIN SEMICHEM CO., LTD., Incheon (KR)

( * ) Notice: Subject to any disclaimer, the term of this patent is extended or adjusted under 35 U.S.C. 154(b) by 0 days.

(21) Appl. No.: 14/779,769

(22) PCT Filed: Mar. 24, 2014

(86) PCT No.: PCT/KR2014/002427
§ 371 (c)(1),
(2) Date: Sep. 24, 2015

(87) PCT Pub. No.: WO2014/157881
PCT Pub. Date: Oct. 2, 2014

(65) Prior Publication Data
US 2016/0053132 A1    Feb. 25, 2016

(30) Foreign Application Priority Data

Mar. 26, 2013  (KR) .................. 10-2013-0032330

(51) Int. Cl.
*B44C 1/22* (2006.01)
*C03C 15/00* (2006.01)
*C03C 25/68* (2006.01)
*C23F 1/00* (2006.01)
*C09D 165/02* (2006.01)
*G03F 7/09* (2006.01)
*G03F 7/40* (2006.01)

(52) U.S. Cl.
CPC .............. *C09D 165/02* (2013.01); *G03F 7/094* (2013.01); *G03F 7/40* (2013.01)

(58) Field of Classification Search
CPC .......... G03F 7/40; G03F 7/094; C09D 165/02
USPC ........................................ 216/47; 430/270.1
See application file for complete search history.

(56) References Cited

FOREIGN PATENT DOCUMENTS

| JP | 2010-271654 A | 12/2010 |
|---|---|---|
| JP | 2012-77295 A | 4/2012 |
| KR | 10-2008-0107210 A | 12/2008 |
| KR | 10-0874655 B | 12/2008 |

OTHER PUBLICATIONS

Written Opinion of the International Searching Authority dated Jul. 1, 2014 issued in International Application No. PCT/KR2014/002427.

*Primary Examiner* — Roberts Culbert
(74) *Attorney, Agent, or Firm* — Nath, Goldberg & Meyer; Joshua B. Goldberg; Tankya E. Harkins

(57) ABSTRACT

An under-layer composition of resist having superior thermal stability, etching resistance, gap-filling property and void-preventing property, and a method for forming pattern using the same are disclosed. The under-layer composition of resist comprises: an aromatic ring containing polymer having the repeating unit of the following Formula 1; a compound of the following Formula 4; and an organic solvent.

[Formula 1]
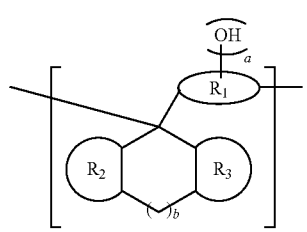
in Formula 1, $R_1$ is a monocyclic or polycyclic aromatic hydrocarbon group having 5 to 20 carbon atoms, $R_2$ and $R_3$ is independently a monocyclic or polycyclic aromatic hydrocarbon group having 4 to 14 carbon atoms, a is an integer of 1 to 3, and b is an integer of 0 to 2.
[Formula 4]
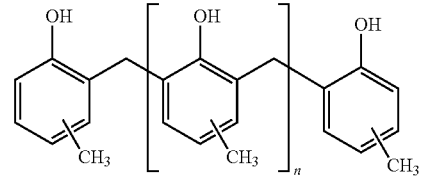
in Formula 4, n is an integer of 1 to 250.
8 Claims, 1 Drawing Sheet

RESIST UNDERLAYER COMPOSITION AND METHOD FOR FORMING PATTERN USING SAME

This is a National Phase Application filed under 35 U.S.C. 371 as a national stage of PCT/KR2014/002427, filed Mar. 24, 2014, an application claiming the benefit of Korean Application No. 10-2013-0032330, filed Mar. 26, 2013, the content of each of which is hereby incorporated by reference in its entirety.

TECHNICAL FIELD

This invention relates to an under-layer composition of resist and a method for forming pattern using the same, and more specifically, to an under-layer composition of resist having superior thermal stability, etching resistance, gap-filling property and void-preventing property, and a method for forming pattern using the same.

BACKGROUND ART

Recently, a size of semiconductor circuit pattern becomes smaller as an integration degree of a large scale integrated circuit (LSI) increases. In the conventional lithography technique using a light exposure, a resolution of a resist or circuit pattern is nearly reduced to an intrinsic resolution which results from a wavelength of the used light. As the conventional light source for the lithography technique for forming the resist pattern, a g-line (436 nm) light source using a mercury lamp and an i-line (365 nm) light source are widely used. Recently, a short wavelength light source such as a KrF excimer laser (248 nm) and a ArF excimer laser (193 nm) is used for the lithography technique for reducing the size of the resist pattern.

Also, as the size of the resist pattern is reduced, the thicknesses of a photoresist layer and the resist pattern should be reduced to prevent collapse of the photoresist pattern. However, it is difficult to properly etch a layer (a substrate to be etched) by using the photoresist pattern having a reduced thickness. Therefore, an inorganic layer or an organic layer having a high etching resistance is formed between the photoresist layer and the substrate to be etched, and such layer is called "(resist) under-layer" or "hard mask". In the substrate etching process, the under-layer is firstly etched and patterned by using the photoresist pattern as a mask, and then the substrate is secondly etched and patterned by using the under-layer pattern as a mask. Such etching process is conventionally called "(resist) under-layer process". The inorganic under-layer used in the under-layer process can be composed of silicon nitride, silicon oxynitride, polysilicon, titanium nitride, amorphous carbon, and so forth, and typically formed by a chemical vapor deposition (CVD) method. The under-layer formed by the chemical vapor deposition (CVD) method is excellent in etching selectivity and etching resistance, but there are some drawbacks of a high instrument cost, difficulty in controlling particles, and so on. Therefore, instead of the inorganic under-layer formed by the deposition process, an organic under-layer, which can be formed by a spin coating process, is studied and developed.

A multilayer resist including the organic under-layer typically has a dual-layer structure (dual-layer resist technique) or a triple-layer structure (triple-layer resist technique). In the dual-layer resist technique, an upper-layer is a photoresist layer in which a pattern can be formed, and the lower-layer (resist under-layer) is formed with a hydrocarbon compound which can be etched by using oxygen gas. The resist under-layer should work as a hard mask in etching the underlying substrate, so the resist under-layer should have a high etching resistance. In addition, it is necessary for the resist under-layer to be formed only by a hydrocarbon compound not including silicon atom for the oxygen gas etching process. Also, a wafer on which the resist under-layer is coated can be a wafer having a flat surface, and also can be a wafer on which a circuit pattern is formed. Since the line width and height of the pattern formed on the wafer have the sizes of about several tens to hundreds nanometer, the resist under-layer substance which is coated on the pattern should have a good gap fill property, in order to be effectively and completely filled between patterns having a height difference. Besides the etching resistance and the gap fill property, the resist under-layer is needed to work as an anti-reflective layer for controlling a standing wave in the overlying resist layer and avoiding a pattern collapse when using a KrF or ArF light source. Specifically, it is necessary to control the light reflection from the under-layer to the overlying resist layer to be less than 1%.

In the triple-layer resist technique, an inorganic hard mask intermediate layer (i.e., the second under-layer composed of an inorganic substance) is further provided between the upper-layer (i.e., a photoresist layer) and the resist under-layer (i.e., the first under-layer composed of a hydrocarbon compound). The second under-layer can be a silicon oxide layer, a silicon nitride layer, or a silicon oxynitride (SiON) layer prepared by the chemical vapor deposition (CVD) method at high temperature. Preferably, the second under-layer can be a SiON layer which is also effective as the anti-reflective layer. The thickness of the second under-layer is 5 to 200 nm, preferably 10 to 100 nm. In order to form the second under-layer (particularly, the SiON layer) on the first resist under-layer, the substrate should be heated up to 240 to 500° C. Thus, the resist under-layer (i.e., the first under-layer) should have a thermal stability at the temperature of 240 to 500° C. If the resist under-layer has not a thermal stability at the high temperature (for example, over 400° C.), the resist under-layer may decompose during the formation of the inorganic hard mask intermediate layer (i.e., the second under-layer), and may contaminate the equipments.

DISCLOSURE OF THE INVENTION

Accordingly, it is an object of this invention to provide an under-layer composition of resist which can form a resist under-layer having superior thermal stability at the high temperature (for example, over 400° C.) and etching resistance, and a method for forming pattern using the same.

It is other object of this invention to provide an under-layer composition of resist having superior gap filling property, and a method for forming pattern using the same.

To achieve these objects, this invention provides an under-layer composition of resist comprising: an aromatic ring containing polymer having the repeating unit of the following Formula 1; a compound of the following Formula 4; and an organic solvent.

[Formula 1]

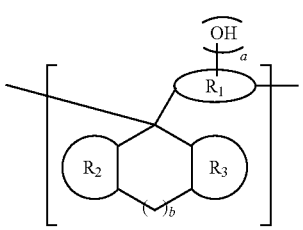

In Formula 1, $R_1$ is a monocyclic or polycyclic aromatic hydrocarbon group having 5 to 20 carbon atoms, $R_2$ and $R_3$ is independently a monocyclic or polycyclic aromatic hydrocarbon group having 4 to 14 carbon atoms, a is an integer of 1 to 3, and b is an integer of 0 to 2.

[Formula 4]

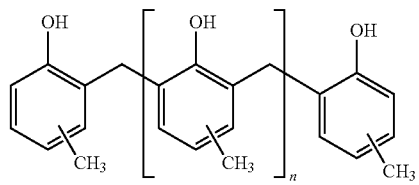

In Formula 4, n is an integer of 1 to 250, preferably an integer of 2 to 150, more preferably an integer of 10 to 100.

This invention also provides a method for forming a pattern using an under-layer composition of resist comprising the steps of: forming a resist under-layer using the under-layer composition of resist on a substrate to be etched; forming a photoresist layer on the resist under-layer; forming a photoresist pattern in the photoresist layer by exposing the photoresist layer to a light of a predetermined pattern; exposing the substrate in accordance with the pattern by selectively removing the photoresist layer and the resist under-layer in accordance with the pattern; and etching the exposed area of the substrate.

Effect of Invention

The resist under-layer formed by the present invention has superior thermal stability at the high temperature (for example, over 400° C.) which is required for forming a hard mask, and has superior gap-filling property when being coated on the patterns having a height difference. The resist under-layer of the present invention has fewer voids due to the superior gap-filling property, and forms a flat surface, and works as organic anti-reflective layer. Also, the resist under-layer of the present invention has superior etching resistance, and works as a protection layer (hard mask) in forming a pattern by a dry etching process.

BEST MODES FOR CARRYING OUT THE INVENTION

Figure 1:
FIGS. 1 and 2 are FE-SEM (Field Emission Scanning Electron Microscope) photographs respectively showing the resist under-layer formed in Comparative Example 4-1 and the resist under-layer formed in Example 4-10.

A more complete appreciation of the invention, and many of the attendant advantages thereof, will be better appreciated by reference to the following detailed description.

The under-layer composition of resist according to the present invention is for forming an under-layer on a substrate such as a silicon wafer by a method such as a spin coating (spin on carbon). The under-layer composition of resist includes an aromatic ring containing polymer having the repeating unit of the following Formula 1; a compound of the following Formula 4; and an organic solvent.

[Formula 1]

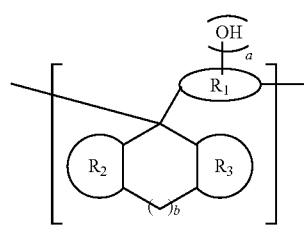

In Formula 1, $R_1$ is a monocyclic or polycyclic aromatic hydrocarbon group having 5 to 20 carbon atoms. For example, $R_1$ ring can be an aromatic ring such as benzene ring, naphthalene ring, biphenyl ring, anthracene ring, phenanthrene ring, triphenyl ring, pyrene ring, binaphthalene ring and so on. $R_2$ and $R_3$ is independently a monocyclic or polycyclic aromatic hydrocarbon group having 4 to 14 carbon atoms. For example, $R_2$ and/or $R_3$ ring can be an aromatic ring such as benzene ring, naphthalene ring and anthracene ring. "a" is the number of hydroxyl group (—OH) which is (are) substituted on $R_1$, and "a" is an integer of 1 to 3. And "b" is an integer of 0 to 2. Also, if necessary, $R_1$, $R_2$ and $R_3$ can be further substituted with a halogen atom, hydroxyl group, nitro group, cyano group, amino group, a lower alkyl group having 1 to 6 carbon atoms and so on.

The aromatic ring containing polymer having the repeating unit of Formula 1 does not include an ethylene group (—CH$_2$—) in its polymer back bone. Typical examples of the aromatic ring containing polymer include polymers having the repeating unit of the following Formula 1a to 1m.

[Formula 1a]

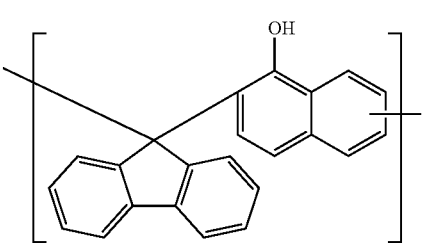

[Formula 1b]

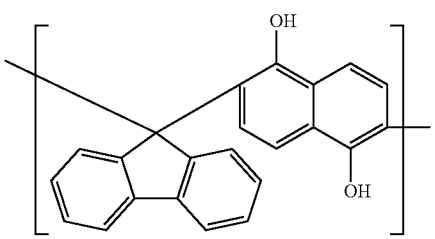

[Formula 1c]
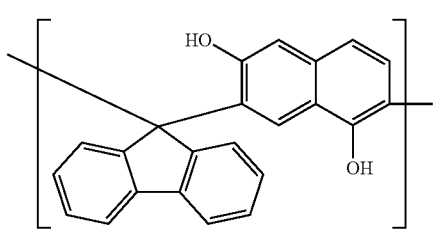
[Formula 1d]
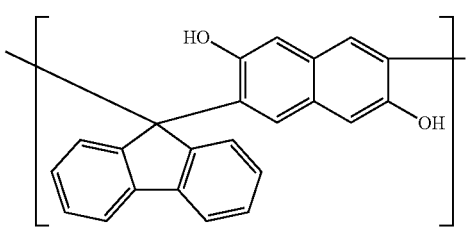
[Formula 1e]
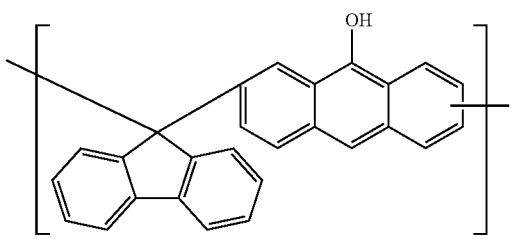
[Formula 1f]
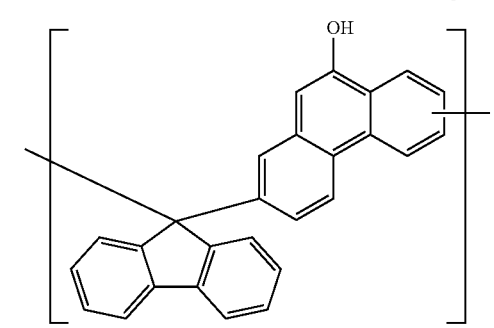
[Formula 1g]
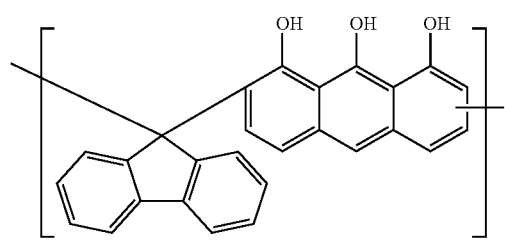
[Formula 1h]
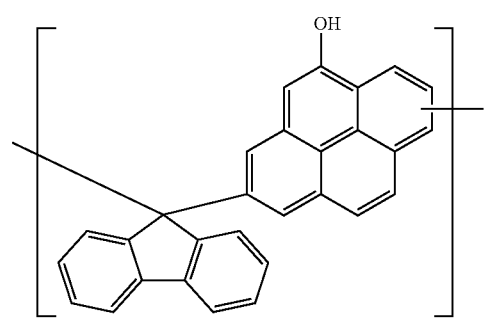
[Formula 1i]
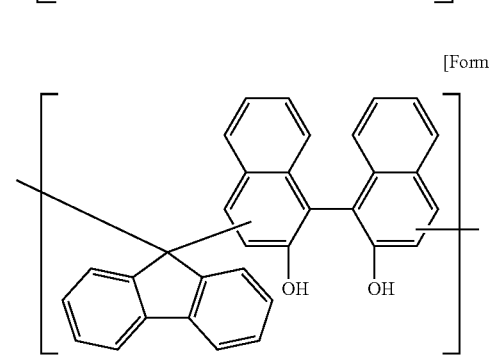
[Formula 1j]
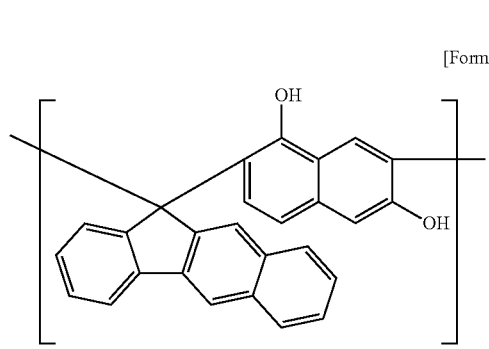
[Formula 1k]
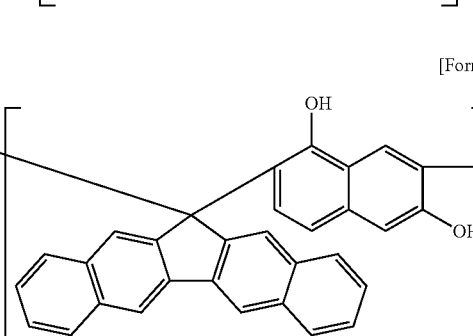
[Formula 1l]
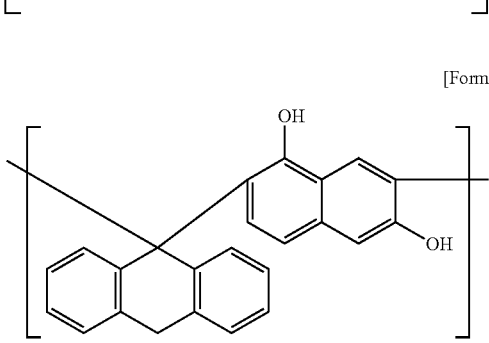

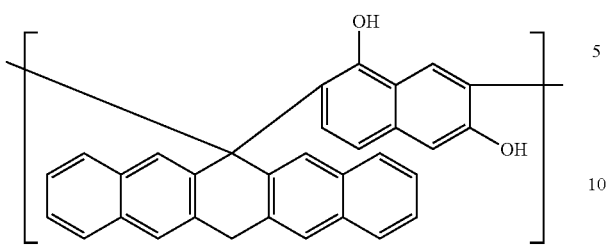

[Formula 1m]

The aromatic ring containing polymer can be prepared, for example, as shown in the following Reaction Scheme 1, by reacting (with heat) a monomer of the following Formula 2 (a cyclic compound having ketone group) and a monomer of the following Formula 3 (a phenol derivative) in a solvent and in the presence of an acid catalyst. Specifically, the aromatic ring containing polymer can be prepared in accordance with the following Manufacturing Examples.

[Reaction Scheme 1]

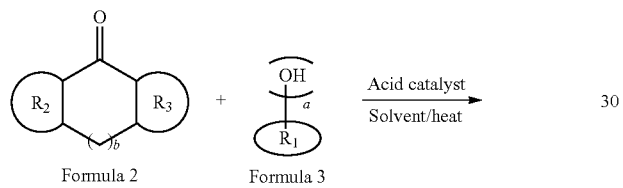

In Reaction Scheme 1, $R_1$, $R_2$, $R_3$, a and b are same as defined in Formula 1.

Typical examples of the monomer of Formula 2 include

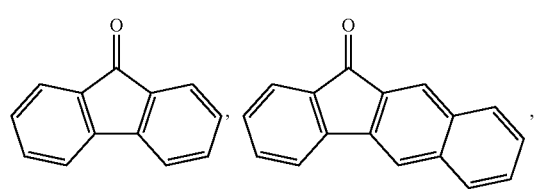

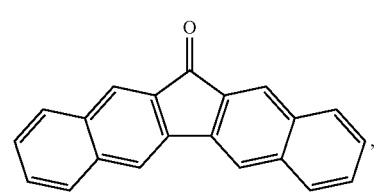

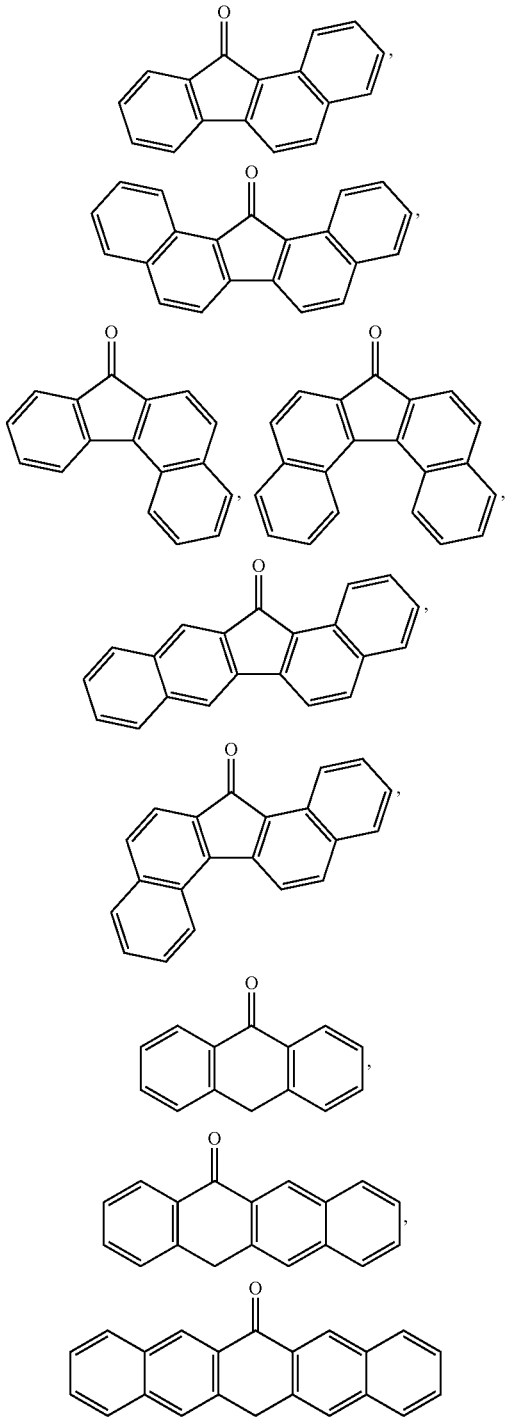

and so on. And, typical examples of the monomer of Formula 3 include

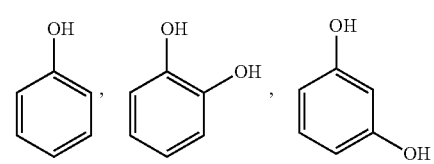

-continued

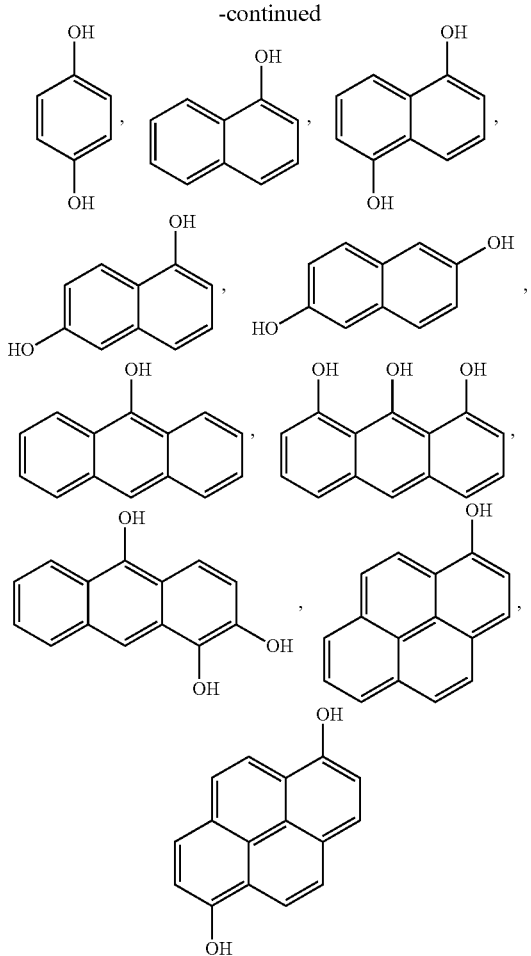

and so on.

In the preparation of the aromatic ring containing polymer (Reaction Scheme 1), the amount of the monomer of Formula 3 is 0.5 to 4 times, preferably 1 to 2 times, more preferably 1 to 1.2 times in mole ratio with respect to the amount of the monomer of Formula 2. When the amount of the monomer of Formula 3 is more than 4 times in mole ratio with respect to the amount of the monomer of Formula 2, the ratio of the phenol derivative (the monomer of Formula 3) having a hydroxyl group is too high, and the polymer may be not properly formed. When the amount of the monomer of Formula 3 is less than 0.5 times in mole ratio with respect to the amount of the monomer of Formula 2, yield of the polymer may decrease because of the high ratio of the cyclic compound having the ketone group (the monomer of Formula 2). Also, the aromatic ring containing polymer having the repeating unit of Formula 1 can also include other repeating unit of a small amount (for example, less than 10 mole % under the condition that the other repeating unit does not deteriorate the function of the polymer.

The acid catalyst used in the preparation of the aromatic ring containing polymer can be a conventional acid catalyst, for example, can be sulfuric acid, hydrochloric acid, phosphoric acid, and an organic acid such as paratoluenesulfonic acid, methyl sulfonic acid, oxalic acid, acetic acid, the mixtures thereof, and so on. The amount of the acid catalyst is 5 to 100 parts by mole, preferably 10 to 50 parts by mole, more preferably 10 to 20 parts by mole with respect to 100 parts by mole of the monomer of Formula 2. When the amount of the acid catalyst is less than 5 parts by mole with respect to 100 parts by mole of the monomer of Formula 2, rate of the reaction may be slow and time of the reaction may be prolonged. When the amount of the acid catalyst is more than 100 parts by mole with respect to 100 parts by mole of the monomer of Formula 2, by using a excessive acid, excessive sodium hydroxide should be used in a neutralization process after the completion of reaction, and because of this, much neutralization time may be required. As the solvent useful for the preparation of the aromatic ring containing polymer, a conventional organic solvent which can dissolve the reactants (for example, monomers) can be used without any limitation. Preferable organic solvent includes toluene, xylene, 1,2,3,4-tetra hydronaphthalene (THN) and so on.

With the acid catalyst, a mercaptothiol derivative can be further used in preparing the aromatic ring containing polymer. The mercaptothiol derivative works as a catalyst which decreases an activation energy of the polymerization reaction and accelerate the polymerization reaction even when there is a steric hindrance between the phenol derivative and the cyclic compound including a ketone group. Examples of the mercaptothiol derivative include 2-mercaptoethanol, 2-mercaptopropanol, 3-mercaptopropanol, 4-mercaptobutanol, the mixtures thereof and so on. When the mercaptothiol derivative is used, the amount of the mercaptothiol derivative is 50 to 100 parts by mole, preferably 60 to 90 parts by mole with respect to 100 parts by mole of the acid catalyst. When the amount of the mercaptothiol derivative is less than 50 parts by mole with respect to 100 parts by mole of the acid catalyst, synthesis of the polymer may not be carried out smoothly, and when the amount of the mercaptothiol derivative is more than 100 parts by mole with respect to 100 parts by mole of the acid catalyst, there is no additional advantage in the reaction rate or yield.

The weight average molecular weight (Mw) of the aromatic ring containing polymer having the repeating unit of Formula 1 is, for example, 200 to 50,000, preferably 400 to 10,000, more preferably 500 to 8,000. When the weight average molecular weight of the aromatic ring containing polymer is less than 200, the resist under-layer may not be properly formed, and when the weight average molecular weight of the aromatic ring containing polymer is more than 50,000, the polymer may not be dissolved in the solvent, and the under-layer composition of resist may be not properly prepared.

[Formula 4]

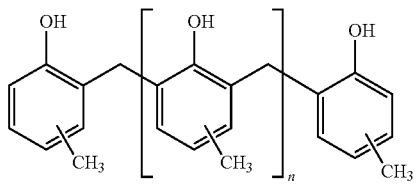

In Formula 4, n is an integer of 1 to 250, preferably an integer of 2 to 150, more preferably an integer of 10 to 100. The weight average molecular weight of the compound of Formula 4 is, for example, 200 to 30,000, preferably 300 to 20,000, more preferably 500 to 10,000. When the weight average molecular weight of the compound of Formula 4 is too small, a coating surface may become faulty during the coating, or the generation of the outgas may be increased during the heating process in a high temperature. And, when the weight average molecular weight of the compound of Formula 4 is too high, the compound may not be dissolved in the solvent, and a height difference of the under-layer may be generated.

In spin coating (spin on carbon) the under-layer composition of resist on the substrate such as a silicon wafer, the compound of Formula 4 works as an additive (a leveler) for improving the gap filling property of the composition. The compound of Formula 4 (additive) can be a single compound or a polymer, preferably a polymer. Examples of the commercially available compound of Formula 4 include novolac-based polymer such as MER-series (Japan, MEIWA Co., Ltd.).

The organic solvent useful in the present invention can be a conventional organic solvent capable of dissolving the aromatic ring containing polymer having the repeating unit of Formula 1 and the polymer of Formula 4. Examples of the organic solvent include propyleneglycol monomethylether acetate (PGMEA), propyleneglycol monomethyl ether (PGME), cyclohexanone (CH), ethyl lactate (EL), gamma-butyrolactone (GBL), the mixtures thereof and so on.

In the under-layer composition of the present invention, the amount of the aromatic ring containing polymer having the repeating unit of Formula 1 is 1 to 25 wt %, preferably 3 to 20 wt %, more preferably 4 to 16 wt %. When the amount of the aromatic ring containing polymer is less than 1 wt %, the under-layer may not be properly formed. When the amount of the aromatic ring containing polymer is more than 25 wt %, the under-layer may become faulty or uneven. Also, the amount of the compound of Formula 4 is 30 to 150 parts by weight, preferably 50 to 140 parts by weight, more preferably 70 to 110 parts by weight with respect to 100 parts by weight of the aromatic ring containing polymer having the repeating unit of Formula 1. When the amount of the compound of Formula 4 is less than 30 parts by weight with respect to 100 parts by weight of the aromatic ring containing polymer, when coating the under-layer composition on patterns having a height difference, the gap filling property of the under-layer composition is deteriorated, a void may be formed in the under-layer, and a height difference of the under-layer may be produced. And, when the amount of the compound of Formula 4 is more than 150 parts by weight with respect to 100 parts by weight of the aromatic ring containing polymer, the thermal stability of the resist under-layer at the high temperature may be deteriorated, and the etching resistance may be deteriorated. The amount of the organic solvent is the remainder of the solid components such as the aromatic ring containing polymer having the repeating unit of Formula 1, the compound of Formula 4, and so on.

Also, if necessary, the under-layer composition of the present invention may further comprise additives, such as a cross-linking agent, a surfactant, an acid generator, and so forth. The cross-linking agent is used to induce a cross-linking reaction and to harden the under-layer. The conventional cross-linking agent such as melamine type or epoxy type cross-linking agent can be used as the cross-linking agent, and specific examples of the cross-linking agent may include MX-270®, MX-280®, or MX-390® commercially available from Mitsubishi Chemicals Co., Ltd.; or 2-{[4-(2-oxiranyl methoxy)phenoxy]methyl}oxirane. The amount of the cross-linking agent can be 1 to 20 parts by weight, preferably 3 to 15 parts by weight with respect to 100 parts by weight of the aromatic ring containing polymer having the repeating unit of Formula 1. When the amount of the cross-linking agent is less than 1 part by weight with respect to 100 parts by weight of the aromatic ring containing polymer, the degree of cross-linking may not be sufficient. And, when the amount of the cross-linking agent is more than 20 parts by weight with respect to 100 parts by weight of the aromatic ring containing polymer, the stability of the resist may be deteriorated.

The acid generator can be added in order to decrease the cross-linking temperature of the polymer and improve the degree of cross-linking. As the acid generator, a conventional photo acid generator or a thermal acid generator can be used. If necessary, an acid may be used as the acid generator. The thermal acid generator which has a superior catalytic efficiency at high temperature can be preferably used rather than the photoacid generator. The specific examples of the thermal acid generator include TAG®-series manufactured by King Industry Co., Ltd. The amount of the acid generator is 5 parts by weight or less, preferably 1 to 4 parts by weight with respect to 100 parts by weight of the aromatic ring containing polymer. When the amount of the acid generator is more than 5 parts by weight with respect to 100 parts by weight of the aromatic ring containing polymer, the stability of the resist may be deteriorated.

The surfactant is used to prevent coating failures occurring due to an increased amount of the solid components in producing the resist under-layer. The specific examples of the surfactant include SULFINOL®-series manufactured by Air Product Co., Ltd., or F-series (e.g., F-410, F-444, F-477, R-08, or R-30) manufactured by DIC Co., Ltd. The amount of the surfactant is 0.1 to 1 part by weight, preferably 0.2 to 0.8 parts by weight with respect to 100 parts by weight of the total under-layer composition. When the amount of the surfactant is more than 1 part by weight with respect to 100 parts by weight of the total under-layer composition, the under-layer may become faulty or uneven. The under-layer composition of present invention can be prepared by blending the above-mentioned components by conventional methods.

The present invention also provides a method for forming pattern using the under-layer composition. More specifically, the method for forming pattern comprises the steps of: (a) forming a resist under-layer using the under-layer composition of resist on a substrate to be etched (for example, a silicon wafer on which an aluminum layer is formed); (b) forming a photoresist layer on the resist under-layer; (c) forming a photoresist pattern in the photoresist layer by exposing the photoresist layer to a light of a predetermined pattern; (d) exposing the substrate in accordance with the pattern by selectively removing the photoresist layer and the resist under-layer in accordance with the pattern; and (e) and etching the exposed area of the substrate. Also, if necessary, prior to the step (b), a step of forming a conventional silicon-containing resist under-layer (for example, an inorganic under-layer) and/or a bottom anti-reflective coating (BARC) layer can be further carried out.

The step of forming the resist under-layer can be carried out by: applying (for example, spin-coating) the under-layer composition of the present invention on a substrate in a thickness of 40 to 600 nm; and heating at 240 to 400° C., preferably 350 to 400° C. for 50 to 180 seconds. The resist under-layer thus formed has a thickness of 40 to 550 nm. When the heating temperature is less than 240° C., the etching resistance of the under-layer may be deteriorated because the degree of cross-linking is lowered. When the heating temperature is more than 400° C., it may contaminate the equipment by the thermal decomposition of the polymer. The pattern formation of the photoresist layer can be carried out by developing the light-exposed photoresist layer with a conventional alkali solution, such as a TMAH developer. The removal of the resist under-layer can be carried out by a dry etching, for example, using a $CHF_3/CF_4$ gas mixture. And, the substrate can be etched by a plasma etching using a $Cl_2$ or HBr gas. In the present invention, the thickness, the heating temperature and time, and the etching method of the resist underlayer are not limited to the above mentioned conditions, but may be varied according to the process conditions.

The resist under-layer of the present invention includes a polymer having aromatic rings, therefore minimizes a light reflection, and also may work as an organic bottom anti-reflective coating layer. In addition, the resist under-layer completely fills gaps between patterns, and thereby forms a flat surface. Also, the resist under-layer of the present invention works as a protection layer (hard mask) during a dry etching process.

Hereinafter, the preferable examples are provided for better understanding of the present invention. The following examples are provided only for illustrating the present invention, and the present invention is not limited by the following examples.

Manufacturing Example 1

Preparation of Polymer Having the Repeating Unit of Formula 1a 9-fluorenone (18 g, 0.1 mol) and 1,2,3,4-tetrahydronaphthalene (THN, 100 mL) as a solvent were added into a three-neck round-bottom 250 mL-flask in which a reflux condenser is installed, and 1-naphtol (15.8 g, 0.11 mol) was added thereto. After temperature of the flask was increased to 130° C., 3-mercaptopropanol (3.2 g, 0.03 mol) was added to the reactor (flask), and 18N sulfuric acid (3.4 g) was slowly added thereto. After addition of the sulfuric acid, the reaction was carried out for 18 hours at 150° C. After completion of the reaction, reactor was cooled down to room temperature, and 2N sodium hydroxide (NaOH) was added into the reactor to control the pH of the reaction solution. After adjusting pH of the reaction solution to 7, removed a water layer of the reactor. Again, the temperature of reactor was increased to 90° C., and washed the reaction solution three times using a hot water. After washing, temperature of the reactant was cooled down to room temperature again, and the reactant was slowly dropped into methanol (1 L) in order to precipitate the polymer in powder form. After precipitating the polymer, the precipitated polymer was dried in a vacuum oven for 6 hours at 60° C. to obtain the polymer having the repeating unit of Formula 1a (20.7 g, Yield: 61%). The weight average molecular weight (Mw) and the polydispersity (PD) of the obtained polymer were measured with a gel permeation chromatography (GPC) (Mw=2,860, PD=3.21).

Manufacturing Example 2

Preparation of Polymer Having the Repeating Unit of Formula 1b

Except for using 1,5-dihydroxynaphthalene (17.6 g, 0.11 mol) instead of 1-naphtol (15.8 g, 0.11 mol), the polymer having the repeating unit of Formula 1b (24.2 g) was obtained in the same manner with Manufacturing Example 1 (Yield: 61%, Mw=3,420, PD=3.61).

Manufacturing Example 3

Preparation of Polymer Having the Repeating Unit of Formula 1c

Except for using 1,6-dihydroxynaphthalene (17.6 g, 0.11 mol) instead of the 1-naphtol, the polymer having the repeating unit of Formula 1c (25.7 g) was obtained in the same manner with Manufacturing Example 1 (Yield: 72%, Mw=3,110, PD=4.26).

Manufacturing Example 4

Preparation of Polymer Having the Repeating Unit of Formula 1d

Except for using 2,6-dihydroxynaphthalene (17.6 g, 0.11 mol)) instead of the 1-naphtol, polymer having the repeating unit of Formula 1d (24.9 g) was obtained in the same manner with Manufacturing Example 1 (Yield: 70%, Mw=4,280, PD=5.11).

Manufacturing Example 5

Preparation of Polymer Having the Repeating Unit of Formula 1e

Except for using 9-hydroxyanthracene (21.3 g, 0.11 mol) instead of the 1-naphtol, polymer having the repeating unit of Formula 1e (17.7 g) was obtained in the same manner with Manufacturing Example 1 (Yield: 45%, Mw=1,990, PD=2.26).

Manufacturing Example 6

Preparation of Polymer Having the Repeating Unit of Formula 1f

Except for using 9-phenanthrenol (21.3 g, 0.11 mol) instead of the 1-naphtol, the polymer having the repeating unit of Formula 1f (18.9 g) was obtained in the same manner with Manufacturing Example 1 (Yield: 48%, Mw=2,150, PD=2.83).

Manufacturing Example 7

Preparation of Polymer Having the Repeating Unit of Formula 1g

Except for using 1,8,9-trihydroxynaphthalene (24.8 g, 0.11 mol) instead of the 1-naphtol, polymer having the repeating unit of Formula 1g (26.2 g) was obtained in the same manner with Manufacturing Example 1 (Yield: 61%, Mw=4,650, PD=4.54).

Manufacturing Example 8

Preparation of Polymer Having the Repeating Unit of Formula 1h

Except for using 1-pyrenol (25.6 g, 0.11 mol) instead of the 1-naphtol, polymer having the repeating unit of Formula 1h (16.8 g) was obtained in the same manner with Manufacturing Example 1 (Yield: 38%, Mw=1,610, PD=2.18).

Manufacturing Example 9

Preparation of Polymer Having the Repeating Unit of Formula 1i

Except for using 1,1'-bi-2-naphthalenol (31.4 g, 0.11 mol) instead of the 1-naphtol, polymer having the repeating unit of Formula 1i (27.2 g) was obtained in the same manner with Manufacturing Example 1 (Yield: 55%, Mw=2,480, PD=2.86).

Manufacturing Example 10

Preparation of Polymer Having the Repeating Unit of Formula 1j

Except for using benzo[b]fluoren-11-one (23.0 g, 0.1 mol) instead of the 9-fluorenone, and using 1,6-dihydroxynaphthalene (17.6 g, 0.11 mol) instead of the 1-naphtol, the polymer having the repeating unit of Formula 1j (21.5 g) was obtained in the same manner with Manufacturing Example 1 (Yield: 53%, Mw=2,650, PD=3.42).

Manufacturing Example 11

Preparation of Polymer Having the Repeating Unit of Formula 1k

Except for using dibenzo[b,h]fluoren-12-one (28.0 g, 0.1 mol) instead of the 9-fluorenone, and using 1,6-dihydroxynaphthalene (17.6 g, 0.11 mol) instead of the 1-naphtol, the polymer having the repeating unit of Formula 1k (23.7 g) was obtained in the same manner with Manufacturing Example 1 (Yield: 52%, Mw=1,810, PD=4.88).

Manufacturing Example 12

Preparation of Polymer Having the Repeating Unit of Formula 1l

Except for using 10H-anthracen-9-one (19.4 g, 0.1 mol) instead of the 9-fluorenone, and using 1,6-dihydroxynaphthalene (17.6 g, 0.11 mol) instead of the 1-naphtol, the polymer having the repeating unit of Formula 1l (23.0 g) was obtained in the same manner with Manufacturing Example 1 (Yield: 62%, Mw=3,860, PD=2.65).

Manufacturing Example 13

Preparation of Polymer Having the Repeating Unit of Formula 1m

Except for using 13H-pentacen-6-one (29.4 g, 0.1 mol) instead of the 9-fluorenone, and using 1,6-dihydroxynaphthalene (17.6 g, 0.11 mol) instead of the 1-naphtol, polymer having the repeating unit of Formula 1m (19.8 g) was obtained in the same manner with Manufacturing Example 1 (Yield: 42%, Mw=2,940, PD=2.91).

Manufacturing Example 14

Preparation of Polymer Having the Repeating Unit of Formula 5

After bisphenol fluorine (100 g) was added into a 250 mL-flask which is refluxed with nitrogen, and 37% formaldehyde aqueous solution (35 mL) and anhydrous oxalic acid (3 g) were added thereto, temperature of the reactor (flask) was increased to 100° C., and the reaction was carried out for 20 hours. After completion of the reaction, a product was dissolved by using a methyl isobutyl ketone (MIBK, 300 mL), and the acid catalyst (oxalic acid) was removed by washing as a deionized water. After removing the acid catalyst, the methyl isobutyl ketone was removed by reduced pressure, and the product was dried to obtain polymer having the repeating unit of Formula 5 (62 g). The polymer thus synthesized was then measured in regard to the weight average molecular weight (Mw) and the polydispersity (PD) using gel permeation chromatography (GPC) that polystyrene was used to a criteria substance (Mw=7,410, PD=4.53).

[Formula 5]

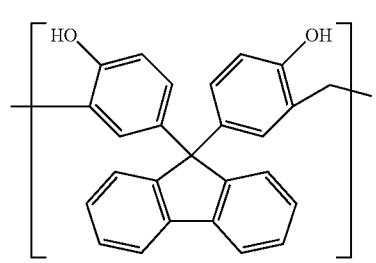

Experimental Example 1-1 to 1-13 and Reference Example 1-1 to 1-2

Measuring a Thermal Stability of Polymer

In order to measure a thermal stability of the aromatic ring containing polymer prepared in Manufacturing Examples 1 to 13, the polymer having the repeating unit of Formula 5 prepared in Manufacturing Example 14, and the polymer having the repeating unit of the following Formula 6 (wherein, m is an integer of 0 to 3, Mw=7,410, PD=4.53, meta/para reaction rate (m:p=6:4)), a mass loss amount (weight %) at 400° C. was measured with a thermo gravimetric analyzer (TGA, TA Co., Ltd.). The results are shown in the following Table 1.

[Formula 6]

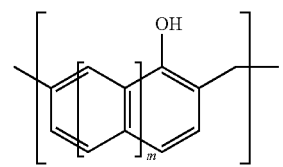

TABLE 1

| | Polymer | Heating temperature (° C.) | Mass loss amount (wt %) |
|---|---|---|---|
| Experimental Example 1-1 | Formula 1a | 400 | 4.1 |
| Experimental Example 1-2 | Formula 1b | 400 | 4.8 |
| Experimental Example 1-3 | Formula 1c | 400 | 4.5 |
| Experimental Example 1-4 | Formula 1d | 400 | 3.8 |
| Experimental Example 1-5 | Formula 1e | 400 | 3.6 |
| Experimental Example 1-6 | Formula 1f | 400 | 4.2 |
| Experimental Example 1-7 | Formula 1g | 400 | 4.6 |
| Experimental Example 1-8 | Formula 1h | 400 | 3.9 |
| Experimental Example 1-9 | Formula 1i | 400 | 3.1 |

TABLE 1-continued

| Polymer | | Heating temperature (° C.) | Mass loss amount (wt %) |
|---|---|---|---|
| Experimental Example 1-10 | Formula 1j | 400 | 2.4 |
| Experimental Example 1-11 | Formula 1k | 400 | 2.6 |
| Experimental Example 1-12 | Formula 1l | 400 | 3.8 |
| Experimental Example 1-13 | Formula 1m | 400 | 2.8 |
| Reference Example 1-1 | Formula 5 | 400 | 19.8 |
| Reference Example 1-2 | Formula 6 | 400 | 71.2 |

Example 1-1 to 1-9 and Comparative Example 1-1 to 1-17

Preparation of Under-Layer Composition of Resist

In order to prepare the under-layer composition of resist, the polymer synthesized in Manufacturing Examples 1 to 14 (polymer having the repeating unit of Formula 1a to 1m and Formula 5), the polymer having the repeating unit of Formula 6, the compound of Formula 4 (leveler, MER-series (Japan, MEIWA Co., Ltd.)) and the cross-linking agent (tetramethoxymethyl glycoluril, MX-270) were used in the amount shown in the following Table 2. Also, 0.1 g of a pyridinium para-toluenesulfonate (0.1 g) as a catalyst and a surfactant (0.04 g, R-08, manufactured by DIC Co., Ltd.) were added into the each component. And, after the each component was dissolved to mixed solvent of propyleneglycol monomethylether acetate (PGMEA, 60 g) and cyclohexanone (CH, 29 g), filtering with a microfilter of 0.45 μm-caliber, and the prepared under-layer composition of resist was used in a lithography process utilizing a multi layer resist.

TABLE 2

| | Polymer resin | | Leveler | | Cross-linking agent |
|---|---|---|---|---|---|
| | Polymer | Amount | Addition agent | Amount | |
| Comparative Example 1-3 | Formula 1a | 10 g | — | — | MX-270/1 g |
| Comparative Example 1-4 | Formula 1b | 10 g | — | — | MX-270/1 g |
| Comparative Example 1-5 | Formula 1c | 10 g | — | — | MX-270/1 g |
| Comparative Example 1-6 | Formula 1d | 10 g | — | — | MX-270/1 g |
| Comparative Example 1-7 | Formula 1e | 10 g | — | — | MX-270/1 g |
| Comparative Example 1-8 | Formula 1f | 10 g | — | — | MX-270/1 g |
| Comparative Example 1-9 | Formula 1g | 10 g | — | — | MX-270/1 g |
| Comparative Example 1-10 | Formula 1h | 10 g | — | — | MX-270/1 g |
| Comparative Example 1-11 | Formula 1i | 10 g | — | — | MX-270/1 g |
| Comparative Example 1-12 | Formula 1j | 10 g | — | — | MX-270/1 g |
| Comparative Example 1-13 | Formula 1k | 10 g | — | — | MX-270/1 g |
| Comparative Example 1-14 | Formula 1l | 10 g | — | — | MX-270/1 g |
| Comparative Example 1-15 | Formula 1m | 10 g | — | — | MX-270/1 g |
| Comparative Example 1-16 | Formula 1a | 10 g | — | — | — |
| Comparative Example 1-17 | Formula 1h | 10 g | — | — | — |
| Example 1-1 | Formula 1a | 6.5 g | MER-7940S | 3.5 g | — |
| Example 1-2 | Formula 1a | 6.5 g | MER-7940F | 3.5 g | — |
| Example 1-3 | Formula 1a | 6.5 g | MER-7950S | 3.5 g | — |
| Example 1-4 | Formula 1a | 6.5 g | MER-7959S | 3.5 g | — |
| Example 1-5 | Formula 1a | 6.5 g | MER-7966 | 3.5 g | — |
| Example 1-6 | Formula 1a | 6.5 g | MER-7968 | 3.5 g | — |
| Example 1-7 | Formula 1a | 6.5 g | MER-7981S | 3.5 g | — |
| Example 1-8 | Formula 1a | 5.0 g | MER-7966 | 5.0 g | — |
| Example 1-9 | Formula 1a | 3.5 g | MER-7966 | 6.5 g | — |
| Comparative Example 1-1 | Formula 5 | 10 g | — | — | MX-270/1 g |
| Comparative Example 1-2 | Formula 6 | 10 g | — | — | MX-270/1 g |

Example 2-1 to 2-9 and Comparative Example 2-1 to 2-17

Preparation of Resist Under-Layer and Evaluation of Optical Property

The each under-layer composition prepared in Example 1-1 to 1-9 and Comparative Example 1-1 to 1-17 was applied on a silicon wafer by spin coating and baked (heated) at 240° C. for 1 minute using a hot plate to prepare a resist under-layer having a thickness of 200 nm. The refractive index (n-value) and the light absorption coefficient (k-value) of the resist under-layer at wavelengths of 248 nm and 193 nm were measured with a spectroscopic ellipsometer (manufactured by J. A. Woollam Co., Inc.), and the results are shown in the following Table 3. Also, the wafer was dipped in ethyl lactate (EL), propylene glycol monomethylether (PGME), propylene glycol monomethylether acetate (PGMEA) and cyclohexanone (CH) respectively for 1 minute, and then the thickness of the dipped wafer was measured, which shows that all the resist under-layer were not dissolved with the conventional solvents and there were no thickness changes.

TABLE 3

| | Refractive index n (at 248 nm) | light absorption coefficient K (at 248 nm) | Refractive index n (at 193 nm) | light absorption coefficient K (at 193 nm) |
|---|---|---|---|---|
| Comparative Example 2-3 | 1.80 | 0.76 | 1.40 | 0.53 |

TABLE 3-continued

| | Refractive index n (at 248 nm) | light absorption coefficient K (at 248 nm) | Refractive index n (at 193 nm) | light absorption coefficient K (at 193 nm) |
|---|---|---|---|---|
| Comparative Example 2-4 | 1.86 | 0.78 | 1.41 | 0.49 |
| Comparative Example 2-5 | 1.91 | 0.78 | 1.44 | 0.51 |
| Comparative Example 2-6 | 1.89 | 0.76 | 1.38 | 0.53 |
| Comparative Example 2-7 | 1.95 | 0.72 | 1.41 | 0.42 |
| Comparative Example 2-8 | 1.88 | 0.79 | 1.44 | 0.40 |
| Comparative Example 2-9 | 1.97 | 0.73 | 1.39 | 0.44 |
| Comparative Example 2-10 | 1.98 | 0.81 | 1.35 | 0.37 |
| Comparative Example 2-11 | 1.91 | 0.81 | 1.39 | 0.52 |
| Comparative Example 2-12 | 1.94 | 0.76 | 1.41 | 0.54 |
| Comparative Example 2-13 | 1.97 | 0.78 | 1.41 | 0.53 |
| Comparative Example 2-14 | 1.86 | 0.77 | 1.45 | 0.60 |
| Comparative Example 2-15 | 1.97 | 0.72 | 1.39 | 0.51 |
| Comparative Example 2-16 | 1.78 | 0.78 | 1.38 | 0.51 |
| Comparative Example 2-17 | 1.95 | 0.79 | 1.36 | 0.40 |
| Example 2-1 | 1.78 | 0.73 | 1.44 | 0.56 |
| Example 2-2 | 1.80 | 0.78 | 1.36 | 0.54 |
| Example 2-3 | 1.81 | 0.81 | 1.42 | 0.54 |
| Example 2-4 | 1.75 | 0.78 | 1.42 | 0.55 |
| Example 2-5 | 1.84 | 0.78 | 1.40 | 0.51 |
| Example 2-6 | 1.79 | 0.75 | 1.44 | 0.61 |
| Example 2-7 | 1.79 | 0.79 | 1.39 | 0.58 |
| Example 2-8 | 1.84 | 0.82 | 1.45 | 0.54 |
| Example 2-9 | 1.80 | 0.82 | 1.41 | 0.55 |
| Comparative Example 2-1 | 1.96 | 0.82 | 1.54 | 0.70 |
| Comparative Example 2-2 | 1.98 | 0.87 | 1.62 | 0.81 |

TABLE 4

| | Bake temperature (° C.) | Etching rate (Å/sec) | Bake temperature (° C.) | Etching rate (Å/sec) |
|---|---|---|---|---|
| Comparative Example 3-3 | 240 | 88 | 400 | 85 |
| Comparative Example 3-4 | 240 | 78 | 400 | 77 |
| Comparative Example 3-5 | 240 | 86 | 400 | 89 |
| Comparative Example 3-6 | 240 | 81 | 400 | 80 |
| Comparative Example 3-7 | 240 | 80 | 400 | 80 |
| Comparative Example 3-8 | 240 | 78 | 400 | 76 |
| Comparative Example 3-9 | 240 | 76 | 400 | 74 |
| Comparative Example 3-10 | 240 | 87 | 400 | 82 |
| Comparative Example 3-11 | 240 | 74 | 400 | 76 |
| Comparative Example 3-12 | 240 | 84 | 400 | 84 |
| Comparative Example 3-13 | 240 | 75 | 400 | 76 |
| Comparative Example 3-14 | 240 | 91 | 400 | 82 |
| Comparative Example 3-15 | 240 | 86 | 400 | 88 |
| Comparative Example 3-16 | 240 | 77 | 400 | 76 |
| Comparative Example 3-17 | 240 | 79 | 400 | 74 |
| Example 3-1 | 240 | 92 | 400 | 87 |
| Example 3-2 | 240 | 89 | 400 | 86 |
| Example 3-3 | 240 | 94 | 400 | 89 |
| Example 3-4 | 240 | 92 | 400 | 88 |
| Example 3-5 | 240 | 90 | 400 | 87 |
| Example 3-6 | 240 | 91 | 400 | 85 |
| Example 3-7 | 240 | 85 | 400 | 83 |
| Example 3-8 | 240 | 86 | 400 | 82 |
| Example 3-9 | 240 | 88 | 400 | 82 |
| Comparative Example 3-1 | 240 | 112 | 400 | 106 |
| Comparative Example 3-2 | 240 | 123 | 400 | — |

Example 3-1 to 3-9 and Comparative Example 3-1 to 3-17

Preparation of Resist Under-Layer and Evaluation of Etching Rate

In order to measure a dry etching rate (etching rate using a $CF_4/CHF_3$ based mixed gas), after the each under-layer composition prepared in Examples 1-1 to 1-9 and Comparative Example 1-1 to 1-17 was applied on a silicon wafer in a thickness of 300 nm, the each under-layer was baked (heated) at 240° C. and 400° C. for 1 minute to prepare a resist under-layer. And, the wafer on which the resist under-layer was formed was etched in $CF_4/CHF_3$ gas condition using an etching equipment (TCP9400SE, manufactured by Lam Research Co., Inc.). Etching rate (Å/sec) was measured from the thicknesses of the resist under-layer before and after the etching, and the results are shown in the following Table 4.

Example 4-1 to 4-9 and Comparative Example 4-1 to 4-17

Preparation of Resist Under-Layer and Evaluation of Gap Fill Property

Figure 2:
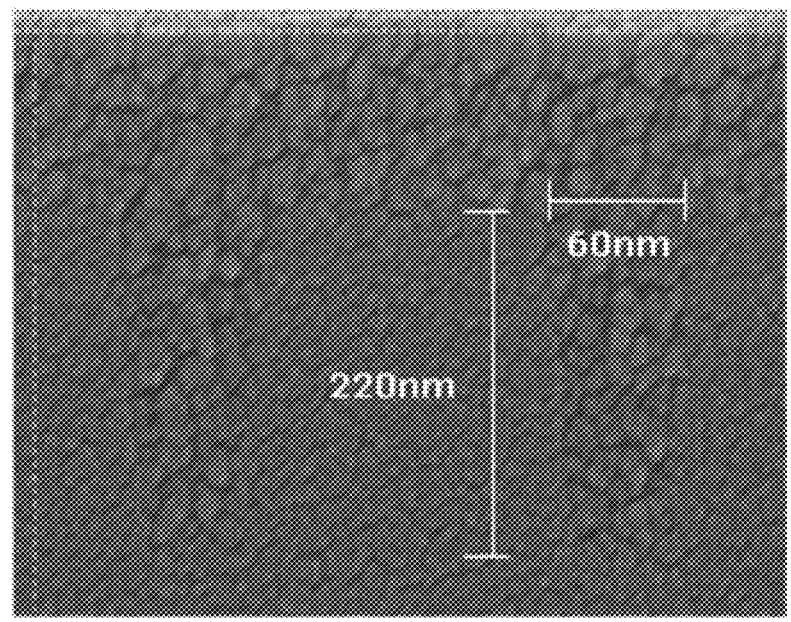

A wafer, on which a pattern (width of line: 150 nm, width of space: 60 nm, height of line: 220 nm) is formed, was prepared. After the each under-layer composition of resist prepared in Examples 1-1 to 1-9 and Comparative Examples 1-1 to 1-17 was applied in a thickness of 250 nm by spin coating on the wafer, the under-layer composition was baked (heated) at 400° C. for 1 minute using a hot plate to prepare a resist under-layer. The profile of resist under-layer was observed by using a FE-SEM (Field Emission Scanning Electron Microscope, S-4300, Hitachi co., Ltd.). When the height difference between the height of the resist under-layer at the line portion and the height of the resist under-layer at the space portion is less than 3 nm, it was judged as "very good", when the height difference is 3 to 10 nm, it was judged as "good", when the height difference is more than 10 nm, it was judged as "poor", and the results are shown in the following Table 5. Also, FE-SEM photographs of the resist under-layer profile prepared in Comparative Example 4-1 and Example 4-10 were shown in FIG. 1 and FIG. 2 respectively. As shown in FIG. 1, the resist under-layer prepared in Comparative Example 4-1 has an uneven surface.

TABLE 5

| | Gap filling property |
| --- | --- |
| Comparative Example 4-3 | poor |
| Comparative Example 4-4 | poor |
| Comparative Example 4-5 | good |
| Comparative Example 4-6 | poor |
| Comparative Example 4-7 | good |
| Comparative Example 4-8 | poor |
| Comparative Example 4-9 | poor |
| Comparative Example 4-10 | poor |
| Comparative Example 4-11 | good |
| Comparative Example 4-12 | good |
| Comparative Example 4-13 | poor |
| Comparative Example 4-14 | good |
| Comparative Example 4-15 | good |
| Comparative Example 4-16 | poor |
| Comparative Example 4-17 | good |
| Example 4-1 | very good |
| Example 4-2 | very good |
| Example 4-3 | very good |
| Example 4-4 | very good |
| Example 4-5 | very good |
| Example 4-6 | very good |
| Example 4-7 | very good |
| Example 4-8 | very good |
| Example 4-9 | very good |
| Comparative Example 4-1 | poor |
| Comparative Example 4-2 | poor |

The present invention relates to the polymer for preparing the resist under-layer which has improved thermal stability, a gap filling property, an optical property and an etching resistance. Conventional resist under-layer has thermal stability at the temperatures of less than 250° C., but at the high temperatures of more than 400° C., the conventional resist under-layer did not have the required thermal stability. In the present invention, the thermal stability at the high temperatures of more than 400° C. is improved by using the polymer having the repeating unit of Formula 1. Also, in the present invention, the gap filling property and the evenness (flatness) of the resist under-layer were improved by using a novolac resin or styrene derivative resin of Formula 2 as an additive.

The invention claimed is:
1. An under-layer composition of resist comprising:
an aromatic ring containing polymer having the repeating unit of the following Formula 1,

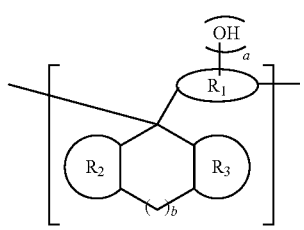

[Formula 1]

in Formula 1, $R_1$ is a monocyclic or polycyclic aromatic hydrocarbon group having 5 to 20 carbon atoms, $R_2$ and $R_3$ is independently a monocyclic or polycyclic aromatic hydrocarbon group having 4 to 14 carbon atoms, a is an integer of 1 to 3, and b is an integer of 0 to 2;

a compound of the following Formula 4,

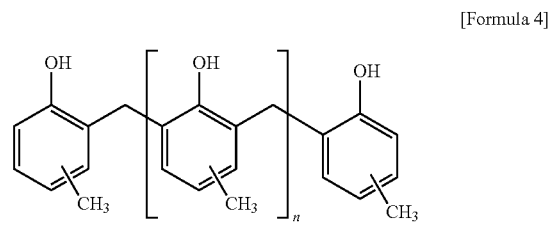

[Formula 4]

in Formula 4, n is an integer of 1 to 250; and
an organic solvent.

2. The under-layer composition of resist according to claim 1, wherein the repeating unit of Formula 1 is selected from the group consisting of the repeating units of the following Formula 1a to 1m

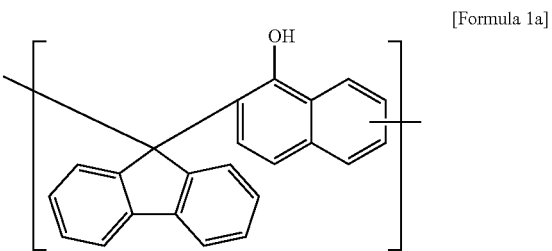

[Formula 1a]

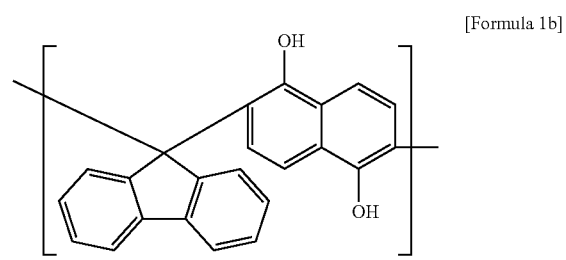

[Formula 1b]

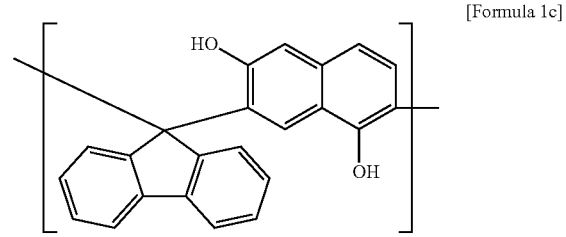

[Formula 1c]

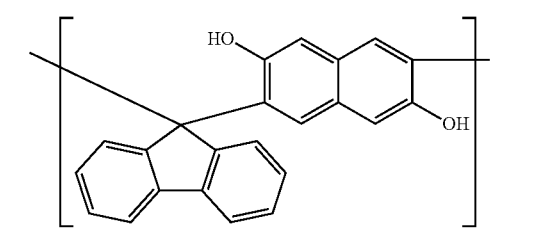

[Formula 1d]

[Formula 1e]

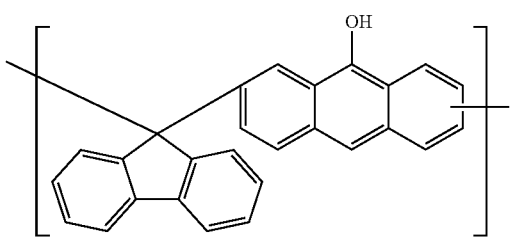

[Formula 1f]

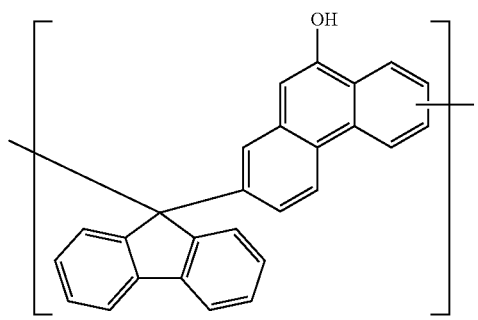

[Formula 1g]

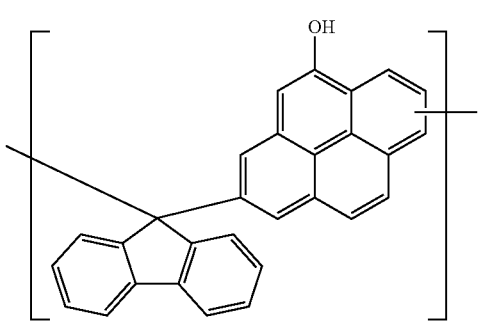

[Formula 1h]

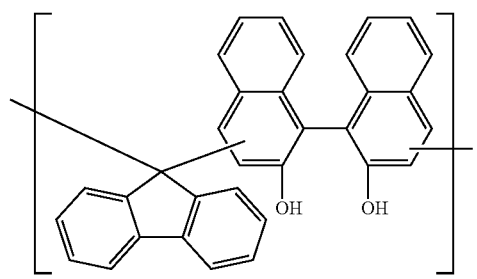

[Formula 1i]

[Formula 1j]

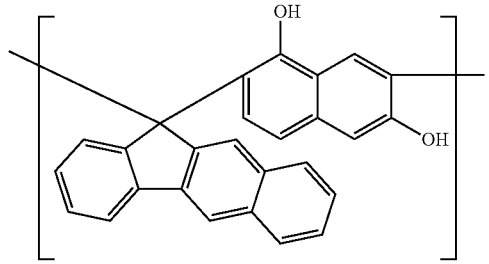

[Formula 1k]

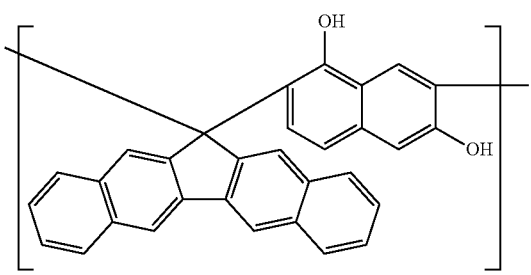

[Formula 1l]

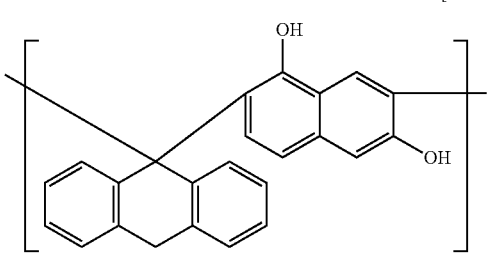

[Formula 1m]

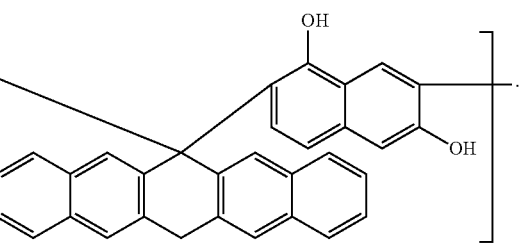

3. The under-layer composition of resist according to claim 1, wherein the weight average molecular weight of the aromatic ring containing polymer having the repeating unit of Formula 1 is 200 to 50,000, and the weight average molecular weight of the compound of Formula 4 is 200 to 30,000.

4. The under-layer composition of resist according to claim 1, wherein the organic solvent is selected from the group consisting of propylene glycol monomethylether acetate (PGMEA), propylene glycol monomethyl ether (PGME), cyclohexanone (CH), ethyl lactate (EL), gamma-butyrolactone (GBL) and the mixtures thereof.

5. The under-layer composition of resist according to claim 1, wherein the amount of the aromatic ring containing polymer having the repeating unit of Formula 1 is 1 to 25 wt. %, and the amount of the compound of Formula 4 is 30 to 150 parts by weight with respect to 100 parts by weight of the aromatic ring containing polymer having the repeating unit of Formula 1 and the remainder is the organic solvent.

6. A method for forming a pattern using an under-layer composition of resist comprising the steps of:

forming a resist under-layer using an under-layer composition of resist on a substrate to be etched;
forming a photoresist layer on the resist under-layer;
forming a photoresist pattern in the photoresist layer by exposing the photoresist layer to a light of a predetermined pattern;
exposing the substrate in accordance with the pattern by selectively removing the photoresist layer and the resist under-layer in accordance with the pattern; and
etching the exposed area of the substrate,
wherein the under-layer composition of resist comprises:
an aromatic ring containing polymer having the repeating unit of the following Formula 1,

[Formula 1]

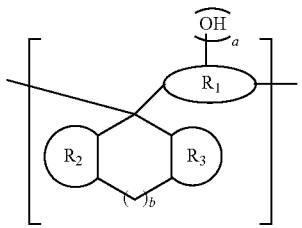

in Formula 1, $R_1$ is a monocyclic or polycyclic aromatic hydrocarbon group having 5 to 20 carbon atoms, $R_2$ and $R_3$ is independently a monocyclic or polycyclic aromatic hydrocarbon group having 4 to 14 carbon atoms, a is an integer of 1 to 3, and b is an integer of 0 to 2;
a compound of the following Formula 4,

[Formula 4]

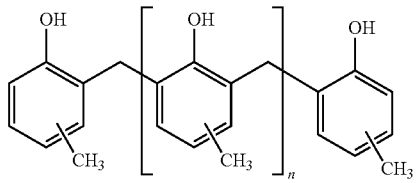

in Formula 4, n is an integer of 1 to 250; and
an organic solvent.

7. The method for forming a pattern according to claim 6, wherein the step of forming the resist under-layer is carried out by: applying the under-layer composition on a substrate in a thickness of 40 to 600 nm; and heating at 240 to 400° C. for 50 to 180 seconds, and the resist under-layer thus formed has a thickness of 40 to 550 nm.

8. The method for forming a pattern according to claim 6, wherein the removing of the resist under-layer is carried out by a dry etching with a $CHF_3/CF_4$ mixed gas.

* * * * *